United States Patent [19]

Winlow

[11] Patent Number: 5,263,149

[45] Date of Patent: Nov. 16, 1993

[54] INTEGRATED CIRCUIT LOGIC FUNCTIONS SIMULATOR FOR SELECTIVELY CONNECTED SERIES OF PREPROGRAMMED PLA DEVICES USING GENERATED SEQUENCE OF ADDRESS SIGNALS BEING PROVIDED BETWEEN SIMULATED CLOCK CYCLES

[75] Inventor: Thomas Winlow, Eastleigh, England

[73] Assignee: International Business Machines Corporation, Armonk, N.Y.

[21] Appl. No.: 657,705

[22] Filed: Feb. 19, 1991

[30] Foreign Application Priority Data

Aug. 3, 1990 [EP] European Pat. Off. ......... 90302520.3

[51] Int. Cl.⁵ .................. G06F 15/20; G06F 15/60
[52] U.S. Cl. .................. 395/500; 364/232.3; 364/232.8; 364/244.9; 364/DIG. 1
[58] Field of Search ........... 395/500, 800; 364/488, 364/489, 578

[56] References Cited

U.S. PATENT DOCUMENTS

| | | | |
|---|---|---|---|
| 4,306,286 | 12/1981 | Cocke et al. | 395/800 |
| 4,697,241 | 9/1987 | Lavi | 364/488 |
| 4,821,173 | 4/1989 | Young et al. | 395/575 |
| 4,852,083 | 7/1989 | Niehaus et al. | 370/58.1 |
| 4,916,647 | 4/1990 | Catlin | 364/578 |
| 5,036,473 | 7/1991 | Butts et al. | 364/489 |
| 5,109,353 | 4/1992 | Sample et al. | 364/578 |

FOREIGN PATENT DOCUMENTS

| | | |
|---|---|---|
| 0076494 | 10/1982 | European Pat. Off. |
| 2578338 | 2/1986 | France |
| 2171805 | 3/1986 | United Kingdom |

Primary Examiner—Robert B. Harrell
Assistant Examiner—Meng-Ai T. An
Attorney, Agent, or Firm—Michael J. Balconi-Lamica; Richard A. Romanchik

[57] ABSTRACT

A hardware simulator comprises a plurality of interconnected programmable logic devices (20) which are connected via a data bus (22) and a control bus (24). Address signals on control bus (24) are read by an interconnect logic block (18) associated with each device to selectively link the output latches and input latches of the devices (20) to the data bus (22). Accordingly, a series of signal transfers is carried out between the devices simulating the hardware. The interconnect logic blocks may be programmed to provide whatever connections between devices are required.

6 Claims, 7 Drawing Sheets

INTEGRATED CIRCUIT LOGIC FUNCTIONS SIMULATOR FOR SELECTIVELY CONNECTED SERIES OF PREPROGRAMMED PLA DEVICES USING GENERATED SEQUENCE OF ADDRESS SIGNALS BEING PROVIDED BETWEEN SIMULATED CLOCK CYCLES

TECHNICAL FIELD

This invention relates to the field of hardware simulators, and more particularly, digital hardware simulators of the type comprising a plurality of interlinked programmable logic arrays.

BACKGROUND ART

It is essential when designing and developing integrated circuits to test the design of the circuit before the circuit is manufactured. This testing is done by simulating how a circuit built to a particular design will operate. The traditional method of logic simulation is to use a software simulator running on a conventional (non parallel) computer. A problem with this method, however, is that the performance of the simulator is usually millions of times slower than the actual performance of the hardware being simulated. This problem is magnified as the size of the chip becomes larger to the point that simulation testing of the current generation of Very Large Scale Integration (VLSI) circuits is becoming impractical.

One solution to this problem is to use special purpose computers to carry out the simulation. These special purpose computers are parallel processors, typically with up to 256 Central Processor Units (CPUs). Special software prepares the logic being simulated so that the processors may work on it in parallel. These systems are extremely expensive, however, in some cases costing millions of dollars.

An alternative less expensive solution which has been suggested is to hard wire programmable logic arrays (PLAs) into simulated circuits. These are integrated circuits that may be programmed or personalized in a few minutes to perform any logical function or combination of logical functions that may be desired. Known PLAs may be programmed to perform the desired function by the use of fusible links or electrical programming techniques such as those used with Electrically Programmable Read Only Memories (EPROMS). Such programmable logic devices have a much lower density than the VLSI integrated circuits they are simulating, though, and so many tens or possibly hundreds of PLAs may be needed to simulate one VLSI integrated circuit.

Another problem with the above approach is the large number of interconnections that have to be made between the PLAs, with each interconnection scheme designed specifically to the hardware being simulated. In the past, interconnections have been hand-wired which is not only extremely time consuming and error prone but also has the result that each simulator is unique to the hardware being simulated and cannot easily be reused. In addition, the control of the wiring and its documentation presents a problem of a similar size to the design and control of the integrated circuit itself. Yet another problem is ensuring that the designs of the simulator and the simulated integrated circuit remain in step as the design of the integrated circuit is modified. Naturally, all the aforementioned problems associated with hand-wired simulators are magnified as the size of the circuits being simulated increases.

DISCLOSURE OF THE INVENTION

An object of the present invention is to provide a hardware simulator which is reprogrammable for different hardware to be simulated.

Another object is to provide a hardware simulator which operates quickly and utilizes minimum components.

According to the present invention, a hardware simulator has a plurality of programmable logic devices, a data bus, a control bus, and a control signal generator, each said device having a set of output latches for storing output signals from said device and a set of input latches for storing input signals to said device, each said set of input latches and each said set of output latches being selectively connected to said data bus under control of a programmable interconnect logic block, and said control signal generator and each said programmable interconnect logic block being connected to said control bus, such that control signals issued by said control signal generator via said control bus control said programmable interconnect logic blocks to connect selected output latches and selected input latches to said data bus to effect a sequence of signal transfer steps in which stored signals are transferred from said selected output latches to said selected input latches via said data bus.

There is no need to hand-wire connections with the present invention. This allows a quicker, less error prone and more automated setting up of the simulator. The present invention also makes it practical to use this type of PLA simulator to simulate VLSI integrated circuit without unmanageable interconnection design control and documentation. It is also easier to make changes to the interconnections as the design of the integrated circuit being simulated is modified. The present invention also allows random logical interconnections to be made via a regular physical hardware structure.

These and other objects, features, and advantages of the present invention will become more apparent in light of the detailed description and exemplary embodiments thereof, as illustrated by the drawings.

BEST MODE FOR CARRYING OUT THE INVENTION

Figure 1:
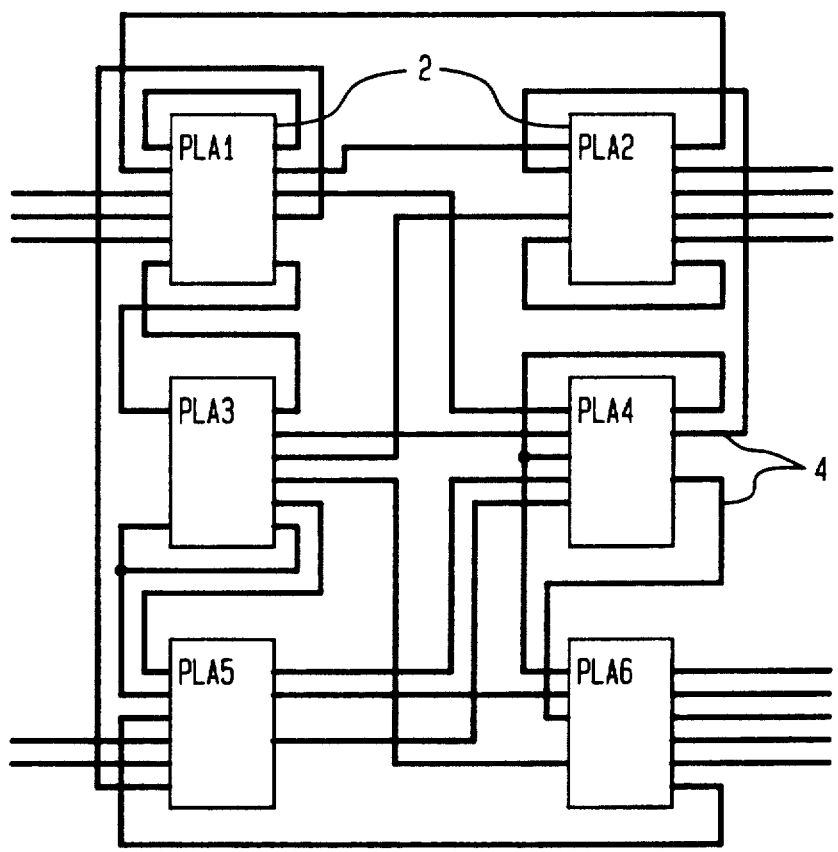
FIG. 1 illustrates the prior art interconnection system for the programmable logic arrays.

FIG. 1 illustrates a known interconnection system for a hardware simulator comprising a plurality of programmable logic arrays (PLAs) (2). As can be seen the hand-wired links (4) are complex even for the relatively small numbers of PLAs (2) shown. As the number of PLAs (2) increases, the complexity and unsuitability of hand-wired links (4) rapidly increases. There is no pattern to the interconnection, which is unique to the integrated circuit being simulated.

Figure 2:
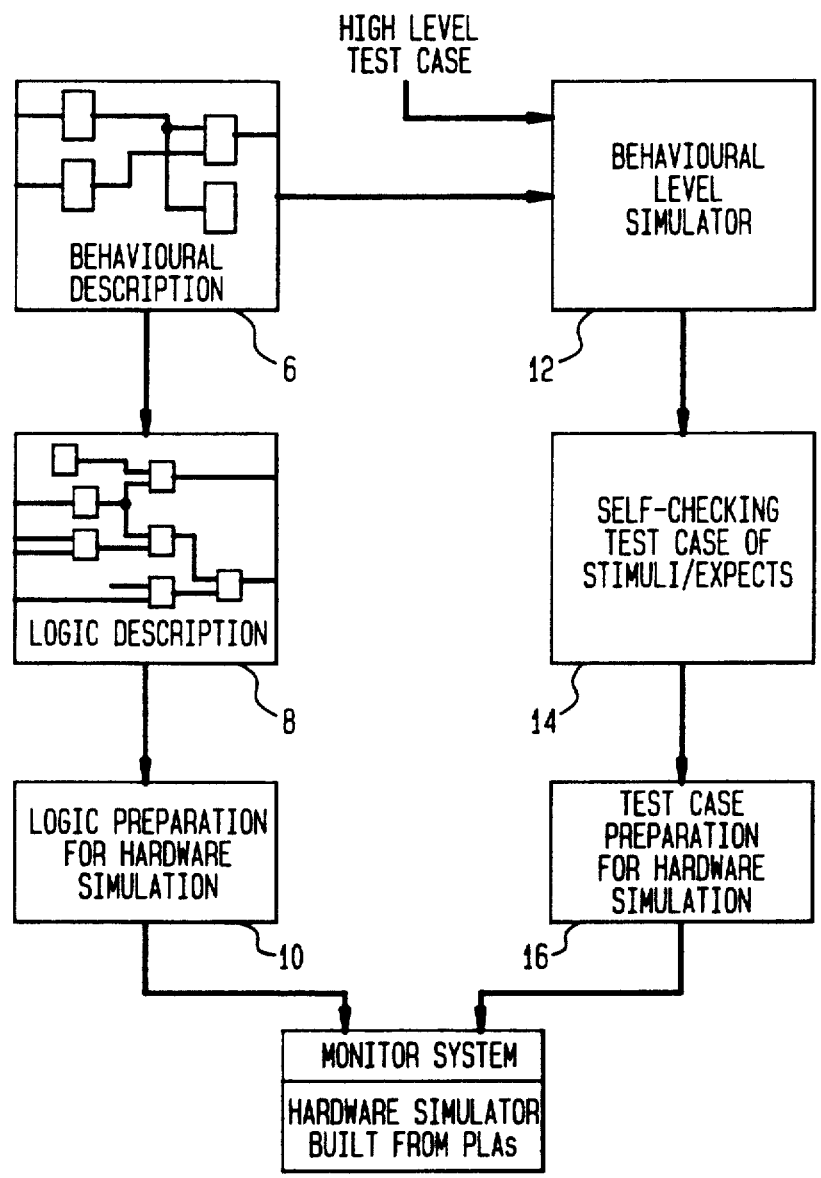
FIG. 2 illustrates the simulation strategy when using a hardware simulator composed of programmable logic arrays.

FIG. 2 illustrates the design flow of a simulation strategy of the present invention using a hardware simulation system composed of programmable logic arrays.

The left hand side of FIG. 2 covers the design of the logic structure. First, a behavioral description (6) is written to verify the design of the whole system. The 'blocks' may be integrated circuits or major portions of integrated circuits. This high level design is converted to a detailed logic description (8) either by hand or by logic synthesis. This logic description (8) is then prepared by software (10) for use on the hardware simulator. There are two parts to this. The first is to determine how to program each of the PLAs to carry out its allocated part of the logical function. The second is to determine the necessary interconnections. As will be discussed later, these interconnections involve the programming of the programmable interconnect logic blocks, which themselves comprise PLAs. All the PLAs will be bulk erased (e.g. by exposure to UV light) on their cards and then programmed in it. The output of the software preparation stage can be a file of programming instructions which can be directly applied to the PLAs. Once the PLAs have been programmed, the hardware simulator contains a model of the integrated circuit being modelled.

The right hand side of FIG. 2 shows the simulation method. When the behavioral model is simulated (12) it produces a self checking test case (14) for the logic level model. This is done by a monitor which records all transitions at the inputs and outputs of a block of logic as if it were the whole system. From these a list of Stimuli and 'Expects' (16) can be generated, one set for each clock cycle. This list is loaded into the monitor system of the hardware simulator. This monitor system applies the first set of stimuli, clocks the programmable logic devices and then checks the appropriate output signals against the expects. No delay simulation is carried out. Timing analysis plus limited software simulation will be adequate for this.

Figure 3:
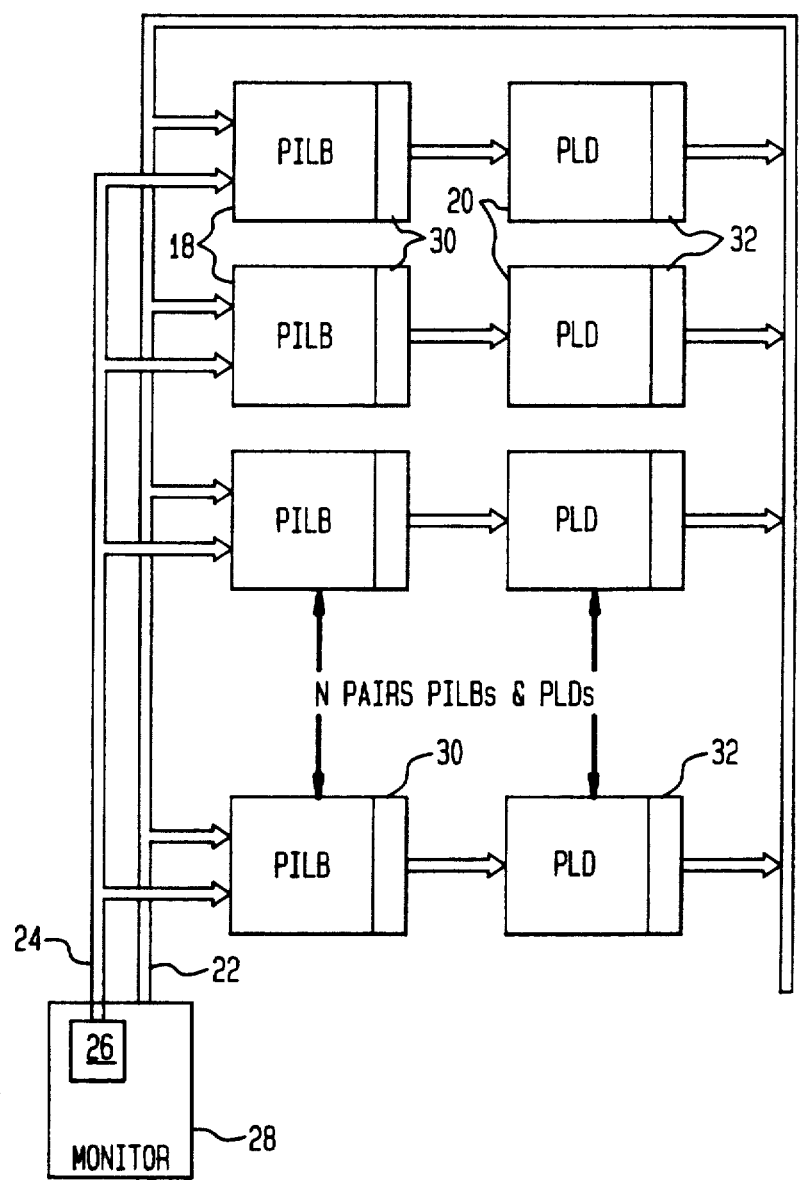
FIG. 3 illustrates the interconnection structure of one embodiment of the invention.
Figure 4:
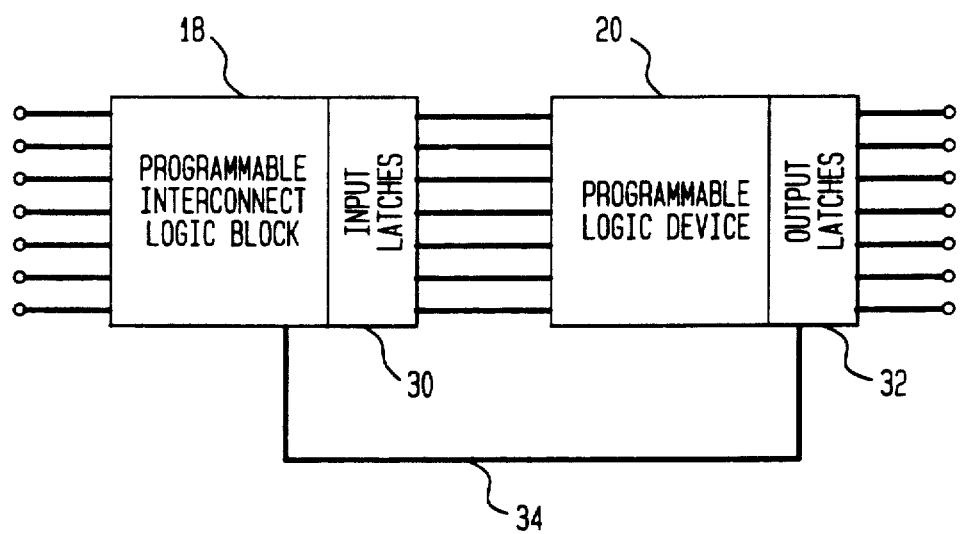
FIG. 4 illustrates a programmable logic device/programmable interconnect logic block unit of one embodiment of the invention.

FIG. 3 illustrates the interconnection structure of one embodiment of the invention and FIG. 4 illustrates a unit comprising a programmable logic device (PLD) (20) and a programmable interconnect logic block (PILB) (18) from which the structure of FIG. 3 is built up. The PLDs (20) and the PILBs (18) are programmed PLAs. All the PLDs (20) and PILBs (18) are linked to a data bus (22) extending therebetween. All the PILBs (18) are connected to an address bus (24) extending therebetween. The address bus (24) is also connected to an address signal generator (26), while the data bus (22) is also connected to a monitor system (28). Both the address signal generator (26) and the monitor system (28) may be embodied within a computer such as a personal computer.

Each PLD (20) is programmed to perform the same logical function as a portion of the hardware being simulated. Associated with each PLD (20) are a set of output signals (32) that correspond to latches within the hardware being simulated and store the output signals from their respective PLD (20). Some of the output latches will be directly feed back into the PLD (20) to enable the simulation of complex logical functions within the PLD (20).

Each PILB (18) is programmed to be responsive to the addresses issued by the address generator (26) on the address bus (24), which may also be considered a control signal generator and a control bus, respectively. The address signal generator (26) sequentially writes addresses corresponding to selected sets of output latches (32) onto the address bus (24). The PILBs watch for the address of their associated set of output latches (32) to be written on the address bus (24) whereupon the PILB (18) triggers, (via line (34)), its associated set of output latches (32) to write their stored output signals onto the data bus (22). The PILBs (18) are also programmed to look for addresses corresponding to the output latch address from which one of their associated set of input latches (30) must receive stored signals. When such an address is on the address bus (24) the addressed PILB (18) responds by connecting its associated input latch (30) to the appropriate line of the data bus (22) from where the selected input latch reads in and stores the signal value which it will feed to the PLD in the next simulated clock cycle.

Thus it can be seen that the function of the PILBs (18) is two-fold. They control the writing of signals onto the data bus (22) by associated output latches (32) and they control the read of signals off the data bus (22) by associated input latches (30). Both of these functions are driven by the sequence of addresses written on the address bus (24). When all the sets of output latches have been addressed each output signal will have been written on the data bus (22) from where it should have been picked up by the appropriate input latch (30).

While this signal transfer is taking place between the various output and input latches the monitor system (28) can read and store the values on the data bus (22). These values effectively give a snap shot picture of the state of the simulated hardware and may be compared with the lists of 'Expects' to check that the hardware is behaving as it should. A mismatch between the signals read and stored and the 'Expects' would be indicative of an error in the circuit design. It is possible for the monitor system (28) only to read and store certain key signals within the simulated hardware to compare with its 'Expects'. If a design error was found at this level the monitor system (28) could be reprogrammed to look in more detail at the latches associated with the latch upon which the error was occurring to assist in the solving of the error.

The monitor system (28) can also be used to supply the 'Stimuli' to the simulator. The monitor system will simply wait for the appropriate address to be written on the address bus (24) whereupon it will write the 'Stimuli' signals on to the data bus (22) from where they will be latched up by the appropriate input latches (30).

Once all the signal transfers have been completed the PLDs (20) will all be clocked to simulate a clock cycle of the hardware being simulated. The clock signal fed to the PLDs (20) to trigger the simulation of a clock cycle may be provided by the monitor system (28) or may be provided by an external clock source (not shown). The appropriate input signals generated in the previous simulated clock cycle will have been transferred to their inputs and a new set of output signals will be generated and stored in the output latches (32). These fresh output signals will then be transferred and the process repeated.

The aforementioned output latches correspond to 'real latches' within the hardware being simulated and the output signals represent the results of the signal processing that has been carried out by the functional logic programmed within the associated PLD during the last simulated clock cycle. The inputs to that functional logic for the last simulated clock cycle were and still are held in the input latches for that PLD. Many of the output latches within the simulator will be holding signals which are in fact required as inputs at other points within the simulator. The task that must be accomplished before the next clock cycle may be simulated is to transfer the signals stored in the output latches to their corresponding input latches as necessary. In the prior art this transfer was carried out by the physical link of a piece of wire, with no separate input latch being needed as the output latch would also directly store the input signal. The present invention provides data and control buses for carrying out the transfer of the signals in the output latches to the input latches where they may then be used to simulate the next clock cycle. The overall operation is that a clock cycle is simulated by the PLAs and then the address signal generator issues a sequence of commands on the address bus to the programmable interconnect logic blocks which drives the necessary signal transfers. Each command results in one or more output latches writing their signals onto the data bus and one or more input latches, which may be associated with the same or a different PLA, to read in and store the signals on the data bus. After the complete sequence of commands has been run through, all the necessary input signals will be in place and up-to-date and the next clock cycle may be simulated.

It will be appreciated that the address signals could take a number of forms and may be considered control signals. What is important is that the programmable interconnect logic devices can interpret the address signals to connect the necessary output latches and input latches to the data bus in the required sequence. One possibility would be to provide a address signal in the form of a master clock signal fed to all the programmable interconnect logic block. The programmable interconnect logic block would have internal clocks synchronized to the master clock and would be programmed to connect the appropriate output latches and input latches to the data bus at predetermined times relative to the master clock signal.

Another feature of the invention concerns the manner in which external input signals may be fed to the simulator to test its response in differing conditions and the manner in which diagnostic information is read from the simulator. A monitor system linked to the data bus and control bus, which is responsive to control signals to read and store output signals from the data bus and to write stimulus signals onto the data bus to be stored in selected input latches, takes advantage of the existing system provided by the hardware simulator to transfer signals between input latches and output latches to feed stimuli into the simulator and read the state of the latches out of the simulator.

It will be appreciated that the majority of the time taken to run a simulation with the present invention is taken up with transfer of the signals between the output latches and the input latches. As the size of the integrated circuit increases, the total number of latches to be simulated increases. Simplistically, one would expect an approximately linear increase in simulation time with the number of latches to be simulated. However, most VLSI circuits are composed of a number of quasi self-contained units or functional islands which have relatively few latches in communication with other parts of the integrated circuit. The present invention exploits this fact by providing a hardware simulator linked to one or more further hardware simulators by a master data bus and a master control bus, wherein a master control signal generator issues master control signals on the master control bus to control the hardware simulators to transfer signals from selected output latches in a first hardware simulator to selected input latches in a second hardware simulator via the master data bus.

Thus it will be seen that the hardware simulators may carry out their internal signal transfers in parallel with the smaller number of signal transfers between hardware simulators (each corresponding to a functional island) taking place separately. This feature allows VLSI integrated circuits to be simulated without the simulation times becoming too large.

Figure 5:
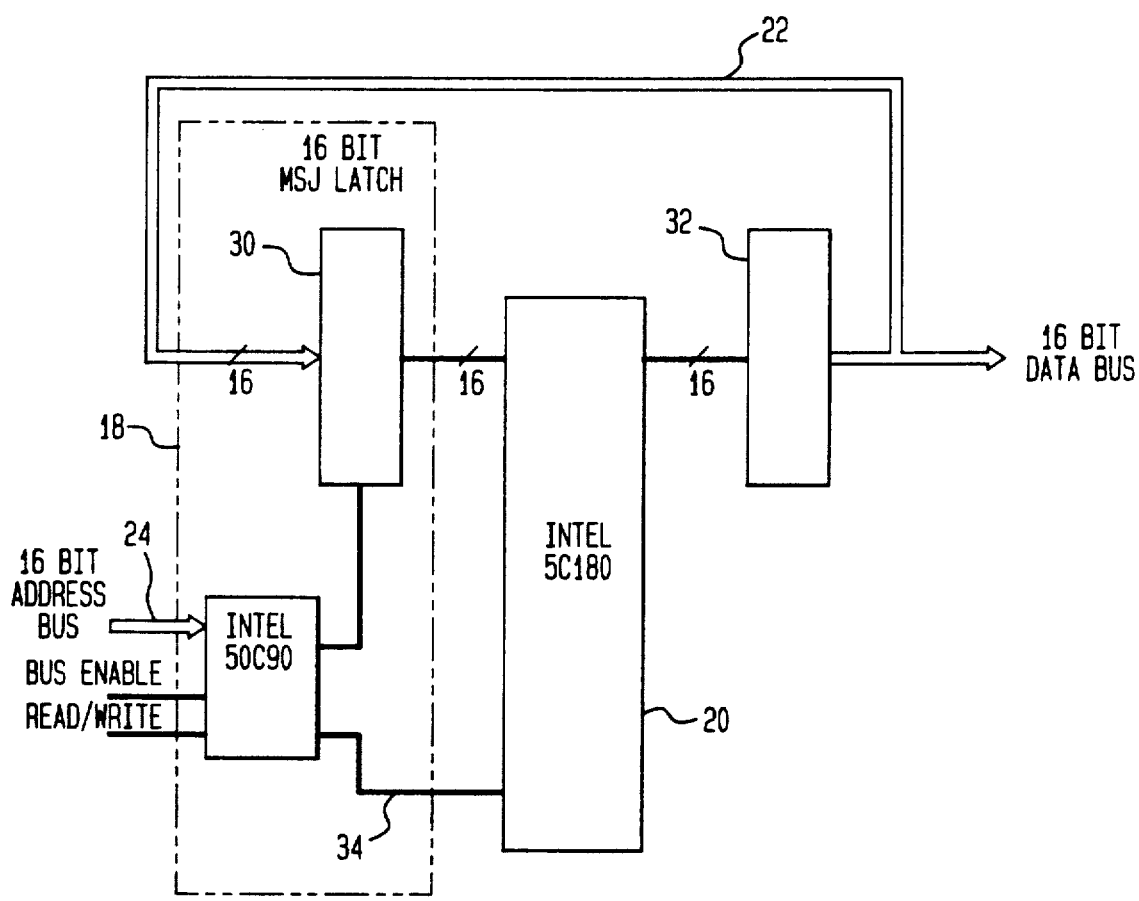
FIG. 5 illustrates in more detail the programmable logic device/programmable interconnect logic block unit shown in FIG. 4.

FIG. 5 shows in more detail an implementation of one sixteen bit unit of the invention. Since current PLAs are not optimized for the PILB (18) function, a small PLA such as an Intel 5C90 is used with a separate MSI register serving as the input latches (30). The PLA (20) may be an Intel 5C180 PLA, which provides more inputs and outputs than are needed for a sixteen bit system. The auxiliary inputs of one PLA (20) may be connected to the auxiliary outputs of another PLA (20) yielding an increase in the capability of the system.

As previously mentioned it is possible to increase the size of the simulator by simply adding more units to the data bus (22) and the address bus (24). However, simply adding units to the bus in this way would increase the time taken to address every latch and complete a data transfer cycle before the next clock cycle could be simulated.

Figure 6:
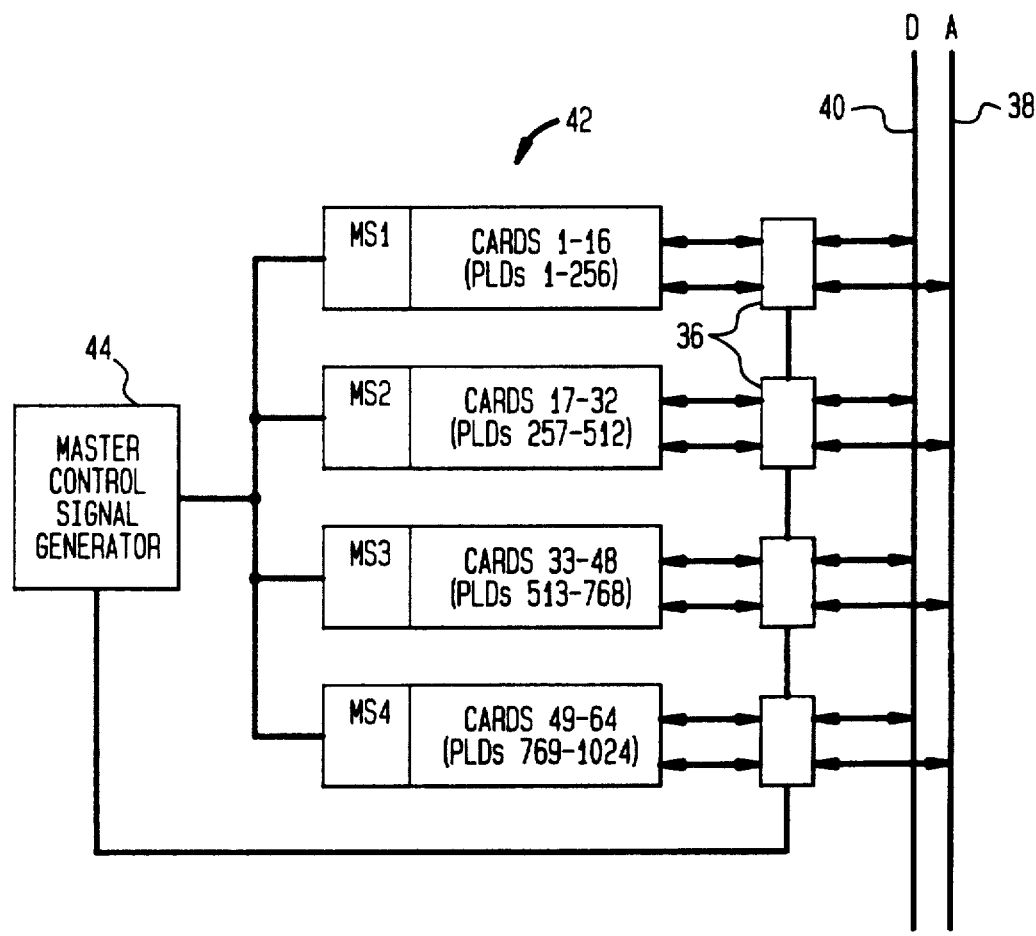
FIGS. 6, 7 and 8 illustrate alternative embodiments for interconnection systems for use when simulation integrated circuits have a large number of latches.

FIG. 6 illustrates a different embodiment of the invention which enables larger integrated circuits to be simulated without too large an increase in the time taken to transfer all the signals around the simulator between simulated clock cycles.

Each of the blocks (42) represents a system as illustrated in FIG. 3. Each of these systems is linked to a master address bus (38) and a master data bus (40). The master address bus corresponds to the master control bus previously described. A master control signal generator (44) monitors the operation of each of the monitor systems (28) within the individual blocks and allows the exchange of signals within each block (42) to proceed in parallel. When the signal exchange within the blocks (42) has been completed the master signal generator (44) then proceeds to carry out the necessary signal transfers between the blocks (42) via the master data bus (40) and the master address bus (38). The master control signal generator (44) is able to selectively connect the local data and address buses within each of the blocks (42) to the master data and address buses via interposed bus transceivers (36). The bus transceivers (36) provide two way switchable gates which allow the local data and address bus in one block (42) to be connected to those of another block via the master data bus (40) and master address bus (38).

The overall operation of this system is that first all the local signal transfers are completed in parallel and then the necessary transfers are undertaken between the blocks (42).

Figure 7:
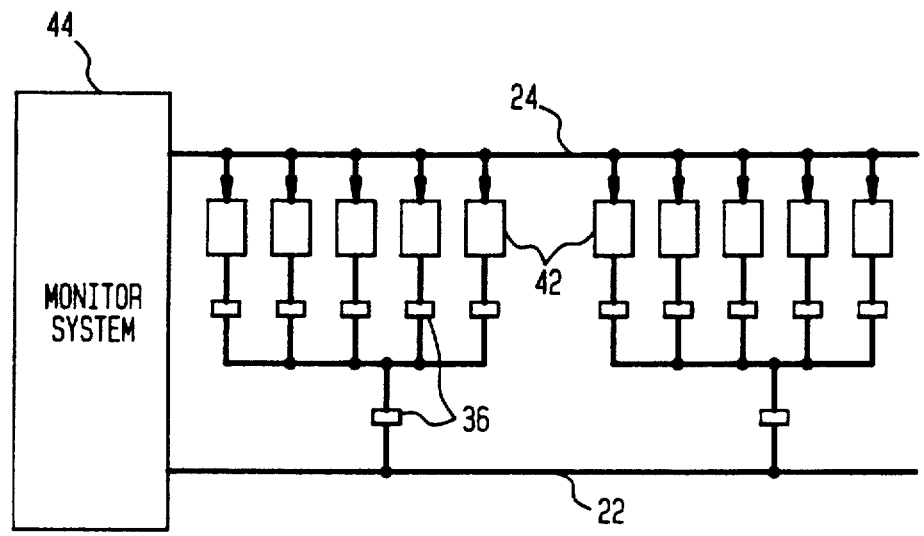
Figure 8:
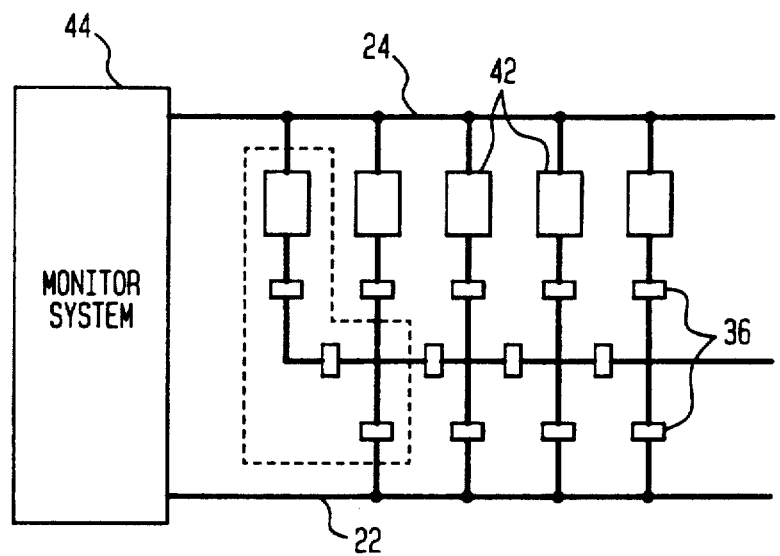

FIGS. 7 and 8 show alternative expanded system configurations. In the embodiment of FIG. 7 one monitor system is used to control two bus systems. The same addresses are supplied to each bus system but the data buses of each can be selectively connected or kept separate by the action of the bus transceivers (36). Accordingly, transfers can take place in parallel within each bus system and the data buses need only be connected when a transfer between bus systems is required. In the embodiment of FIG. 8 the number and size of the local data buses is itself configurable using the bus transceivers (36). The same address signal is supplied to each programmable logic device but the grouping of the devices into local block sharing a data bus is controlled by the bus transceivers (36). Accordingly, some local blocks may be small and others large depending upon the circuit being simulated. FIGS. 7 and 8 illustrate the diversity and flexibility of systems using the present invention.

Although the invention has been shown and described with exemplary embodiments thereof, it should be understood by those skilled in the art that the foregoing and various other changes, omissions and additions may be made thereon and thereto without departing from the spirit and scope of the invention.

I claim:

1. An IC simulator for simulating logic functions of VLSI integrated circuit hardware according to simulated clock cycles initiated by clock signals, said simulator comprising:

data bus means for carrying input and output data signals;

a plurality of programmable logic device (PLD) means selectively connected to said data bus means, said plurality of PLD means for executing preprogrammed algorithmic functions on input data signals and providing corresponding output data signals upon receipt of a clock signal for a simulated clock cycle, each of said PLD means being preprogrammed with an algorithmic function corresponding to a logic function of the integrated circuit hardware being simulated, each said PLD means further having an input latch for storing input data signals prior to executing said algorithmic function and an output latch for storing output data signals resulting from said algorithmic function execution, each said output latch corresponding to a real latch within the integrated circuit hardware being simulated;

address generator means for providing digital address signals in a sequence, the sequence of said digital address signals being provided between said simulated clock cycles;

address bus means for carrying said digital address signals; and a plurality of programmable interconnect logic block (PILB) means connected to said address bus means, each PILB means being connected to a corresponding one of said plurality of PLD means and further being responsive to said digital address signals and preprogrammed for selectively connecting said input and output latches of said corresponding one of said plurality of PLD means to said data bus means, whereby said address generator means controls said plurality of PILB means according to the sequence of said digital address signals to effectuate a corresponding sequence of signal transfer steps in which input and output data signals are transferred from said data bus means to selectively connected input latches or from selectively connected output latches to selectively connected input latches via said data bus means, between said simulated clock cycles.

2. The IC simulator according to claim 1, wherein said digital address signals comprise multibit address signals.

3. The IC simulator of claim 1, further comprising monitor means connected to said data bus means for providing, between said simulated clock cycles, input data signals onto said data bus means to input latches selectively connected to said data bus means according to the sequence of said digital address signals, said monitor means further for reading, between said simulated clock cycles, output data signals stored in output latches corresponding to the selectively connected input latches.

4. The IC simulator according to claim 1, wherein said plurality of PLD means are comprised of programmable logic arrays.

5. The IC simulator according to claim 1, wherein said plurality of PILB means are comprised of programmable logic arrays.

6. An IC simulator for simulating logic functions of VLSI integrated circuit hardware according to simulated clock cycles initiated by clock signals, said simulator comprising:

a plurality of unit simulator means, each said unit simulator means having: a) data bus means for carrying input and output data signals; b) a plurality of programmable logic device (PLD) means selectively connected to said data bus means, said plurality of PLD means for executing preprogrammed algorithmic functions on input data signals and providing corresponding output data signals upon receipt of a clock signal for a simulated clock cycle, each of said PLD means being preprogrammed with an algorithmic function corresponding to a logic function of the integrated circuit hardware being simulated, each said PLD means further having an input latch for storing input data signals prior to executing said algorithmic function and an output latch for storing output data signals resulting from said algorithmic function execution, each said output latch corresponding to a real latch within the integrated circuit hardware being simulated; c) address generator means for providing digital address signals in a sequence, the sequence of said digital address signals being provided between said simulated clock cycles; d) address bus means for carrying said digital address signals; e) a plurality of programmable interconnect logic block (PILB) means connected to said address bus means, each PILB means being connected to a corresponding one of said plurality of PLD means and further being responsive to said digital address signals and preprogrammed for selectively connecting said input and output latches of said corresponding one of said plurality of PLD means to said data bus means, whereby said address generator means controls said plurality of PILB means according to the sequence of said digital address signals to effectuate a corresponding sequence of signal transfer steps in which input and output data signals are transferred from said data bus means to selectively connected input latches or from selectively connected output latches to selectively connected input latches via said data bus means, between said simulated clock cycles;

master data bus means for carrying master data input and output signals; and master controller means for controlling said plurality of unit simulator means to transfer master data input and output signals from said master data bus means to selectively connected input latches of a first unit simulator means or from selectively connected output latches in a first unit simulator means to selectively connected input latches in a second unit simulator means via said master data bus means, between said simulated clock cycles.

* * * * *